(12) United States Patent  
Lee et al.

(10) Patent No.: US 6,635,845 B2  
(45) Date of Patent: Oct. 21, 2003

(54) DRY SURFACE CLEANING APPARATUS USING A LASER

(75) Inventors: Jong-Myong Lee, Yongin-si (KR); Sung Ho Cho, Yongin-si (KR)

(73) Assignee: IMT Co., Ltd., Yongin-si (KR)

( * ) Notice: Subject to any disclaimer, the term of this patent is extended or adjusted under 35 U.S.C. 154(b) by 8 days.

(21) Appl. No.: 10/094,610

(22) Filed: Mar. 12, 2002

(65) Prior Publication Data

US 2002/0170892 A1 Nov. 21, 2002

Related U.S. Application Data

(60) Provisional application No. 60/328,092, filed on Oct. 11, 2001.

(30) Foreign Application Priority Data

May 19, 2001 (KR) .......................................... 2001-27462  
May 19, 2001 (KR) .......................................... 2001-27463  
Oct. 10, 2001 (KR) .......................................... 2001-62277

(51) Int. Cl.$^7$ .............................................. B23K 26/00
(52) U.S. Cl. ........................... 219/121.68; 219/121.73; 219/121.77
(58) Field of Search ...................... 219/121.6, 121.68, 219/121.73, 121.74, 121.77, 121.82, 121.84

(56) References Cited

U.S. PATENT DOCUMENTS 5,023,424 A  6/1991  Vaught  
5,800,625 A  * 9/1998  Engelsberg et al.  
5,958,268 A  * 9/1999  Engelsberg et al.  
6,555,781 B2 * 4/2003  Ngoi et al.

OTHER PUBLICATIONS

J. M. Lee, K. G. Watkins and W. M. Steen, "Laser Shocking Cleaning", Proceedings of ICALEO2000 (19th International Congress on Applications of Lasers & Electro–Optics), Section D, pp. 171–177, Oct. 2000, USA.

J. M. Lee and K G. Watkins, "Removal of Small Particles on Silicon Wafer by Laser induced Airborne Plasma Shock Wave", Journal of Applied Physics, 89(11), pp. 6496–6500, Jun. 2001.

J. M. Lee, K. G. Watkins and W. M. Steen, "Surface Cleaning of Silicon Wafer by Laser Sparking", Journal of Laser Applications, 14(4), pp. 154–158, Aug. 2001.

* cited by examiner

Primary Examiner—Samuel M. Heinrich  
(74) Attorney, Agent, or Firm—Jacobson Holman PLLC

(57) ABSTRACT

A dry surface cleaning apparatus removes surface contaminants on a surface of a workpiece. The dry surface cleaning apparatus includes a laser for generating a laser beam, a beam delivery control unit for splitting the laser beam into a first and a second laser beam, a frequency modulator for modulating the second laser beam to generate a shorter wavelength laser beam and a laser focusing lens for converging the first laser beam on a laser focus around the surface of the workpiece to generate a plasma shock wave around the laser focus.

17 Claims, 4 Drawing Sheets

DRY SURFACE CLEANING APPARATUS USING A LASER

This application claim benefit to Provisional No. 60/328,092 filed Oct. 11, 2001.

FIELD OF THE INVENTION

The present invention relates to a dry surface cleaning apparatus using a laser; and, more particularly, to a dry surface cleaning apparatus using a laser with which a substrate may be cleaned without causing a surface damage regardless of types or sizes of surface contaminants with an enhanced cleaning speed and efficiency.

BACKGROUND OF THE INVENTION

Contaminants such as micron and submicron sized particles on semiconductor surfaces can pose serious problems such as circuit failure and yield loss in a semiconductor device. For example, particles smaller than 0.06 micrometer can cause fatal device defects for a next generation dynamic random access memory and microprocessors. The contamination control on silicon wafers is therefore a crucial issue in the manufacturing thereof. More effective techniques to remove smaller and smaller particles from the surface are required as the density of chip devices keeps increasing. However, those small particles are more difficult to remove due to their higher adhesion force on the surface. Conventional cleaning techniques such as high pressure gas jet, scrubbing, ultrasonic and chemical flux are known to be ineffective in removing the small particles of micron or submicron dimensions and further, there is possibility for them to inflict a mechanical action-based damage in the surface profile as well as an environmental pollution problem due to the considerable water consumption and the use of chemicals.

Recently, a laser cleaning technique has been demonstrated to offer a new environment friendly approach for an effective removal of small particles, since it is a dry process. However, cleaning efficiency is strongly dependent on laser wavelength and physical properties of the particles since the removal of a small particle is closely related with a laser absorption property of the particle surface that produce a cleaning force, wherein a different particle surface produces a different cleaning force. Thus the removal of all particles having different optical and thermal properties by using a single wavelength is difficult due to the different interactions between laser and particles. In addition, cleaning speed is relatively slow due to the small laser spot sizes.

In order to tackle the problems in the conventional laser cleaning, Vaught, in U.S. Pat. No. 5,023,424, describes a shock wave particle removal method and apparatus using a laser induced shock wave to dislodge particles from a wafer surface. A laser beam is focused on a laser focus in the air by a lens so that the air around the laser focus may be ionized to generate a laser induced plasma shock wave and, therefore, the laser induced plasma shock wave is used to clean the wafer surface.

However, a portion of laser beam introduced with the laser induced plasma shock wave is directly introduced toward the wafer surface so that the wafer surface may be damaged.

Also the conventional laser induced plasma shock wave described above may be used to effectively remove inorganic dry particles but the laser induced plasma shock wave may not be used to remove organic contaminated particles and layers remained on the wafer surface.

Since, further, the laser induced plasma shock wave is generated in the air, the shock wave has a lower intensity and some elements such as oxygen within the air may be ionized to cause a surface damage, e.g., an oxidation, on the wafer surface.

SUMMARY OF THE INVENTION

It is, therefore, an object of the present invention to provide a dry surface cleaning apparatus using a laser from which both a first laser beam for generating a laser induced plasma shock wave to remove inorganic surface contaminants and a second laser beam for effectively removing organic surface contaminants may be generated so that organic and inorganic surface contaminants on the wafer surface may be effectively removed.

It is, therefore, another object of the present invention to provide an apparatus for changing the direction of a laser beam which could cause a damage to a wafer surface so that the laser beam may not be illuminated on the wafer surface and, therefore, the surface damage on the wafer surface may be basically prevented.

It is, therefore, still another object of the present invention to provide a dry surface cleaning apparatus with a beam expander and a laser nozzle to increase the intensity of the laser beam, to prevent the wafer surface from being damaged by a chemical reaction and to effectively remove surface contaminants.

In accordance with a preferred embodiment of the present invention, there is provided a dry surface cleaning apparatus for removing surface contaminants on a surface of a workpiece comprising:

a laser for generating a laser beam;

a beam delivery control unit for splitting the laser beam into a first and a second laser beam, wherein the first and the second laser beam propagate along different directions from each other;

a frequency modulator for modulating the second laser beam to generate a shorter wavelength laser beam, wherein the shorter wavelength laser beam has a shorter wavelength than that of the second laser beam and the shorter wavelength laser beam is used to directly detach the surface contaminants on the surface; and a laser focusing lens for converging the first laser beam on a laser focus around the surface of the workpiece to generate a plasma shock wave around the laser focus, wherein the plasma shock wave is used to clean the surface contaminants on the surface.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
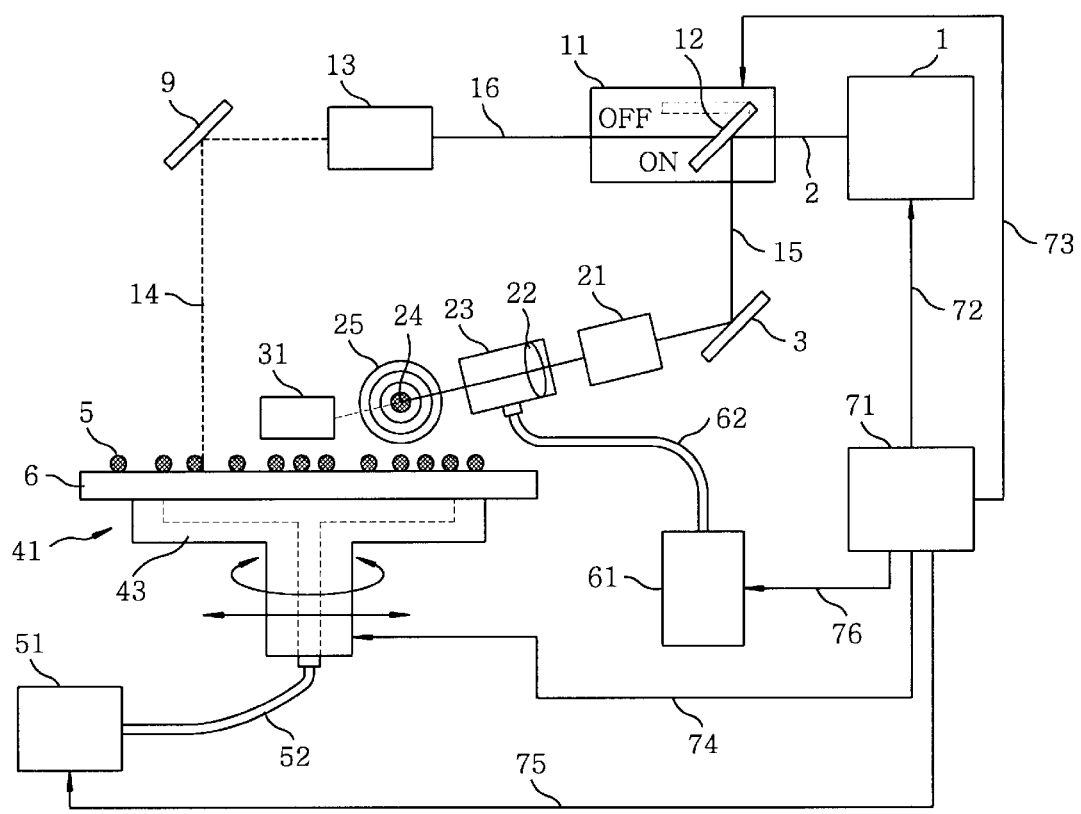
FIG. 1 represents a schematic view for a dry surface cleaning apparatus in accordance with the present invention.

Referring to FIG. 1, there is shown a schematic view for a dry surface cleaning apparatus in accordance with the present invention.

A laser beam 2 generated from a laser 1 splits into two beams propagating along two different paths, a first laser beam 15 for generating a plasma shock wave 25 and a second laser beam 16 for generating a shorter wavelength laser beam 14. A beam delivery control unit 11 is manufactured by either a switching mirror 12 which is operated with an ON-OFF method or a beam splitter (not shown) which is operated with a beam splitting method.

In order to perform a plasma shock wave cleaning, a Q-switched Nd:YAG laser beam 2 with a fundamental wavelength of about 1064 nm is sequentially reflected by the switching mirror 12 and a reflection mirror 3 and, then, proceeds toward the surface of the workpiece 6 as the first laser beam 15. A focus lens 22 may be used to focus the first laser beam 15 so that the plasma shock wave 25 may be generated around a laser focus 24 from airborne plasma generated by laser sparking in the air. The plasma shock wave 25 may be used to remove surface contaminants 5 adhered on the surface of the workpiece 6. The power density of the first laser beam 15 at the laser focus is preferably around $10^{12}$ W/cm$^2$. When gaseous constituents in the air start to break down due to the intense electric field induced by the focused laser beam, they are ionized and rapidly heated to produce the plasma shock wave.

A beam expander 21 may be used to expand the beam size of the first laser beam 15 to increase the power density of the first laser beam 15 around the laser focus 24. Further, a laser nozzle 23 may be used to inject an additional gas along the proceeding direction of the first laser beam 15 as will be specifically described in FIG. 2. A transparent waveguide may be used as a surface damage protector 31 to prevent the surface of the workpiece 6 from being damaged by a portion of the first laser beam 15 that has not been used to generate the plasma shock wave 25.

In order to precisely remove any organic particle or a layer remained on the surface of the workpiece 6, the second laser beam 16 of a fundamental wavelength may be introduced through a frequency harmonic generator 13 while the switching mirror 12 being turned off. The second laser beam 16 of the fundamental wavelength, e.g., 1064 nm, is modulated by the frequency harmonic generator 13 as a shorter wavelength laser beam 14 such as a half wavelength (532 nm) laser beam, a third wavelength (about 355 nm) laser beam or a fourth wavelength (266 nm) laser beam so that such shorter wavelength laser beam 14 may be directly illuminated on the surface of the workpiece 6 by using a reflection mirror 9 to effectively remove the surface contaminants 5 such as organic materials adhered on the surface of the workpiece 6. Further, the cleaning procedure described above may be reversed so that the shorter wavelength laser beam 14 may be first used to remove the organic materials and then the plasma shock wave 25 may be used to detach any other remaining particles. Still further, if the beam delivery control unit 11 is replaced with the beam splitter, both the plasma shock wave 25 and the shorter wavelength laser beam 14 may be concurrently used to perform the surface cleaning. In this way, by using a single laser, one can perform a cost-effective multi-purpose cleaning.

In the meantime, the workpiece 6 is attached on a workpiece holding unit 41. The workpiece holding unit 41 has a vacuum chuck 43 with a cavity to be placed close to another surface, i.e., a back surface, of the workpiece 6; a vacuum pump 51 for evacuating the cavity in order to hold the workpiece 6; and a vacuum line 52 for connecting the vacuum chuck 43 and the vacuum pump 51.

A system controller 71 controls the laser 1 through a laser control line 72, the beam delivery control unit 11 through a beam delivery control line 73, a gas supplier 61 through a gas supplying control line 76 and the vacuum pump 51 through a vacuum pump control line 75. The system controller 71 also makes the workpiece holding unit 41 through a workpiece moving control line 74 move longitudinally and/or horizontally or rotate with respect to the vertical axis of the workpiece 6. The rotation of the workpiece holding unit 41 may cause the surface contaminants 5 detached from the surface of the workpiece 6 to be blown by a rotational force.

Figure 2:
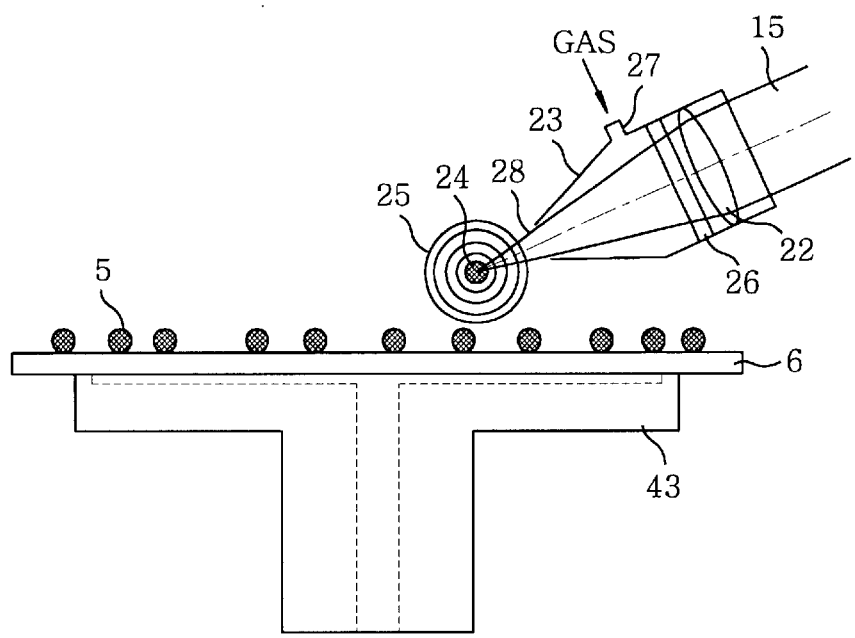
FIG. 2 shows a schematic view for a laser nozzle unit shown in FIG. 1 in accordance with the present invention.

Referring to FIG. 2, there is shown a schematic view for the laser nozzle unit 23 shown in FIG. 1 in accordance with the present invention.

The first laser beam 15 is introduced into the laser nozzle 23. The laser nozzle 23 includes the focus lens 22 for converging the first laser beam 15 onto the laser focus 4, a guard glass 26 for guarding the focus lens 22, a gas entrance 27 for introducing a gas from the gas supplier 61 and a nozzle end 28 for outputting the gas. The gas is jetted through the nozzle end 28 with the laser beam itself. Since the gas preferably proceeds along the proceeding direction of the first laser beam 15 focused, it may allow the particles detached by the plasma shock wave 25 generated around the laser focus 24 to be effectively removed. Also the guard glass 26 may be used to prevent the focus lens 22 from being damaged by the plasma shock wave 25 generated around the laser focus 24 and from being contaminated by the gas itself. If an inert gas such as Ar, He, Ne, $N_2$ and so on is introduced as the gas into the gas entrance 27 on behalf of the real air itself, the plasma may be more easily and forcibly generated around the laser focus 24 so that more powerful shock wave may be generated. The inert gas may reduce surface damages such as surface oxidization by the plasma of oxygen molecules included in the air itself. It has been found that the plasma shock wave generated in an Ar atmosphere is about two times stronger than that generated in the real air which includes about 80% $N_2$ and 20% $O_2$ since the plasma is more easily generated in the Ar atmosphere by a high-density laser beam than in the real air.

Figure 3:
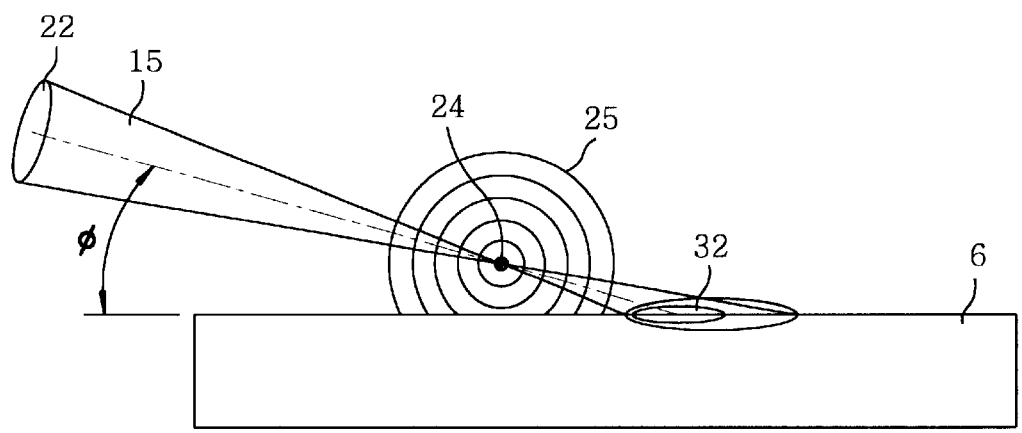
FIG. 3 presents a schematic view for illustrating a surface damage generation under a plasma shock wave.

Referring to FIG. 3, there is shown a schematic view for illustrating a surface damage generation principle under the plasma shock wave.

The focus lens 22 is used to form the laser focus 24 for the first laser beam 15 in a space above the surface of the workpiece 6 to be cleaned. If the energy of the first laser beam 15 around the laser focus 24 is equal to or larger than a threshold, the air itself around the laser focus 24 is ionized to thereby generate a powerful plasma. Accordingly, the corresponding plasma shock wave 25 propagates in all direction, thereby removing all the surface contaminants on the surface of the workpiece 6. However, all the energy of the first laser beam 15 may not be used to generate the plasma shock wave 25 and, therefore, a portion of the first laser beam 15 may propagate along the proceeding direction of the first laser beam 15 onto the surface of the workpiece 6. The first laser beam 15 propagated on the surface of the workpiece 6 is converted into thermal energy on the surface thereof so that a surface damage 32 on the surface thereof may be inflicted. Specially, materials sensitive to heat or light such as semiconductor materials, magnetic materials, organic materials, thin film coating layers and the like may be seriously damaged on the surface thereof.

Figure 4:
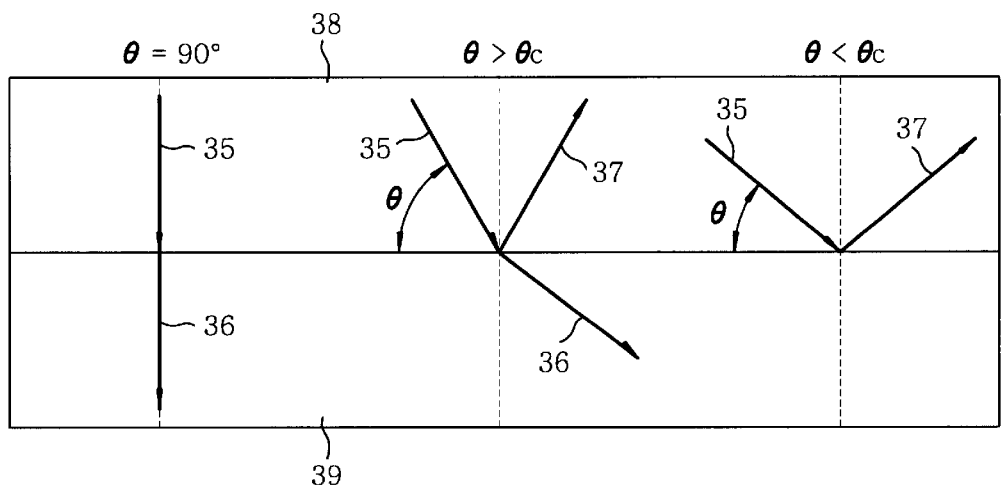
FIG. 4 describes a schematic view for illustrating a basic principle of a surface damage protection in accordance with the present invention.

Referring to FIG. 4, there is shown a schematic view for illustrating a basic principle of a surface damage protection in accordance with the present invention.

When a light propagates from a transparent solid material 38 to the air 39, it may be transmitted to or reflected from the air 39 depending on an incident angle θ. As shown in FIG. 4, if the incident angle θ of an incident light 35 is 90 degrees, almost all light is transmitted to the air 39 as a refractive light 36. If the incident angle is smaller than 90 degrees and larger than a critical angle $θ_c$ for total reflection, a portion of the incident light 35 is reflected from the air 39 as a reflected light 37 and the other portion of the incident light 35 is transmitted to the air 39 as a refracted light 36 with a refraction angle. If, however, the incident angle θ is smaller than the critical angle $θ_c$, the incident light 35 is not leaked out but all the incident light 35 is reflected from the contact surface between the transparent solid material 38 and the air 39. Such phenomenon defined as the total reflection may be used to effectively change the proceeding direction of the laser beam in accordance with the present invention. Some examples of the transparent solid material 38 include glass, quartz, diamond, NaCl crystal and the like, wherein the crystal angles $θ_c$ on the air of glass, quarts and diamond are about 52 degrees, about 47 degrees and about 66 degrees, respectively.

Figure 5:
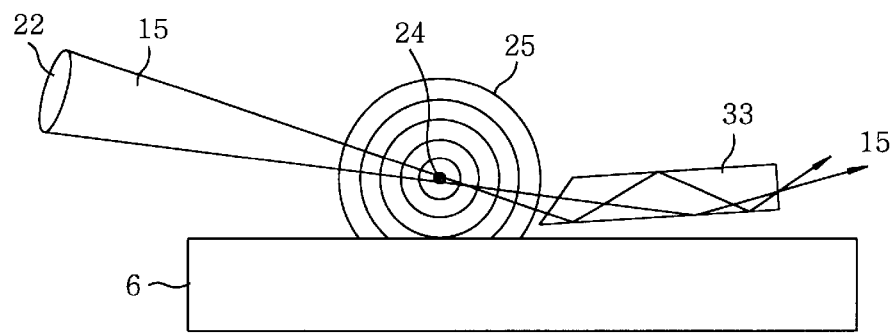
FIG. 5 provides a first embodiment of the surface damage protection in accordance with the present invention.

Referring to FIG. 5, there is shown a first embodiment of the surface damage protection in accordance with the present invention.

A rod 33 made of transparent solid material with a cross-section of circle or polygon may be used as the surface damage protector 31 shown in FIG. 1. The rod 33 is inserted between the laser focus 24 around which the plasma shock wave 25 is generated and the surface of the workpiece 6 on which the laser beam is illuminated. Accordingly, the first laser beam 15 after passing through the laser focus 24 may be introduced to an end portion of the rod 33. As shown in FIG. 5, if the incident angle θ between the first laser beam 15 and the side portion of the rod 33 is smaller than the critical angle $θ_c$ for total reflection, all laser beam transmitted through the end portion of the rod 33 will propagate within the rod 33 and then be emitted through another end of the rod 33 towards the outside thereof. As a result, a rod-type transparent solid material for performing total reflection may be installed to thereby control the propagation direction of the laser beam illuminated on the surface of the workpiece 6. Since the first laser beam 15 has no effect on the surface of the workpiece 6, there is no surface damage inflicted by the first laser beam 15.

Figure 6:
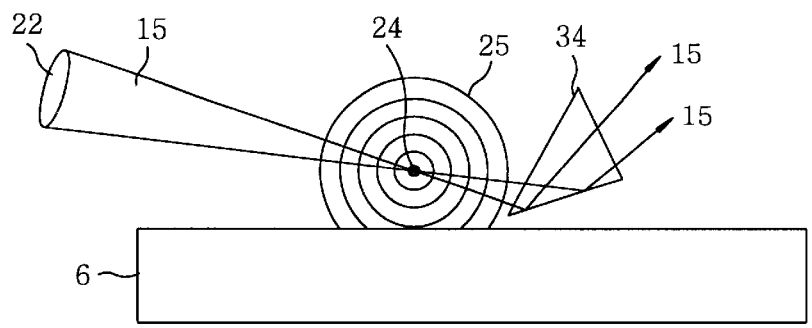
FIG. 6 depicts a second embodiment of the surface damage protection in accordance with the present invention.

Referring to FIG. 6, there is shown a second embodiment of the surface damage protection in accordance with the present invention.

A prism 34 made of transparent solid material may be used as the surface damage protector 31 shown in FIG. 1. The prism 34 is inserted between the laser focus 24 around which the shock wave is generated and the surface of the workpiece 6 on which the laser beam is illuminated so that the first laser beam 15 may be introduced through a surface of the prism 34. As shown in FIG. 6, if the incident angle θ between the laser beam introduced into the prism 34 and a reflection surface of the prism 34 is smaller than the critical angle $θ_c$ for total reflection, all laser beam introduced in the prism 34 is totally reflected and then proceeds towards another surface of the prism 34 to be emitted. Therefore, the prism 34 made of transparent solid material for total reflection may be installed in order that the propagation direction of the laser beam illuminated on the surface of the workpiece 6 may be controlled. Since the first laser beam 15 has no effect on the surface of the workpiece 6, there is no surface damage inflicted by the first laser beam 15.

As shown in FIGS. 5 and 6, it is important that the location and direction of the rod 33 or the prism 34 must be precisely defined in order that the incident angle θ of the first laser beam 15 is allowed to be smaller than the critical angle $θ_c$ for total reflection so that the first laser beam 15 may be totally reflected by the rod 33 or the prism 34.

Figure 7:
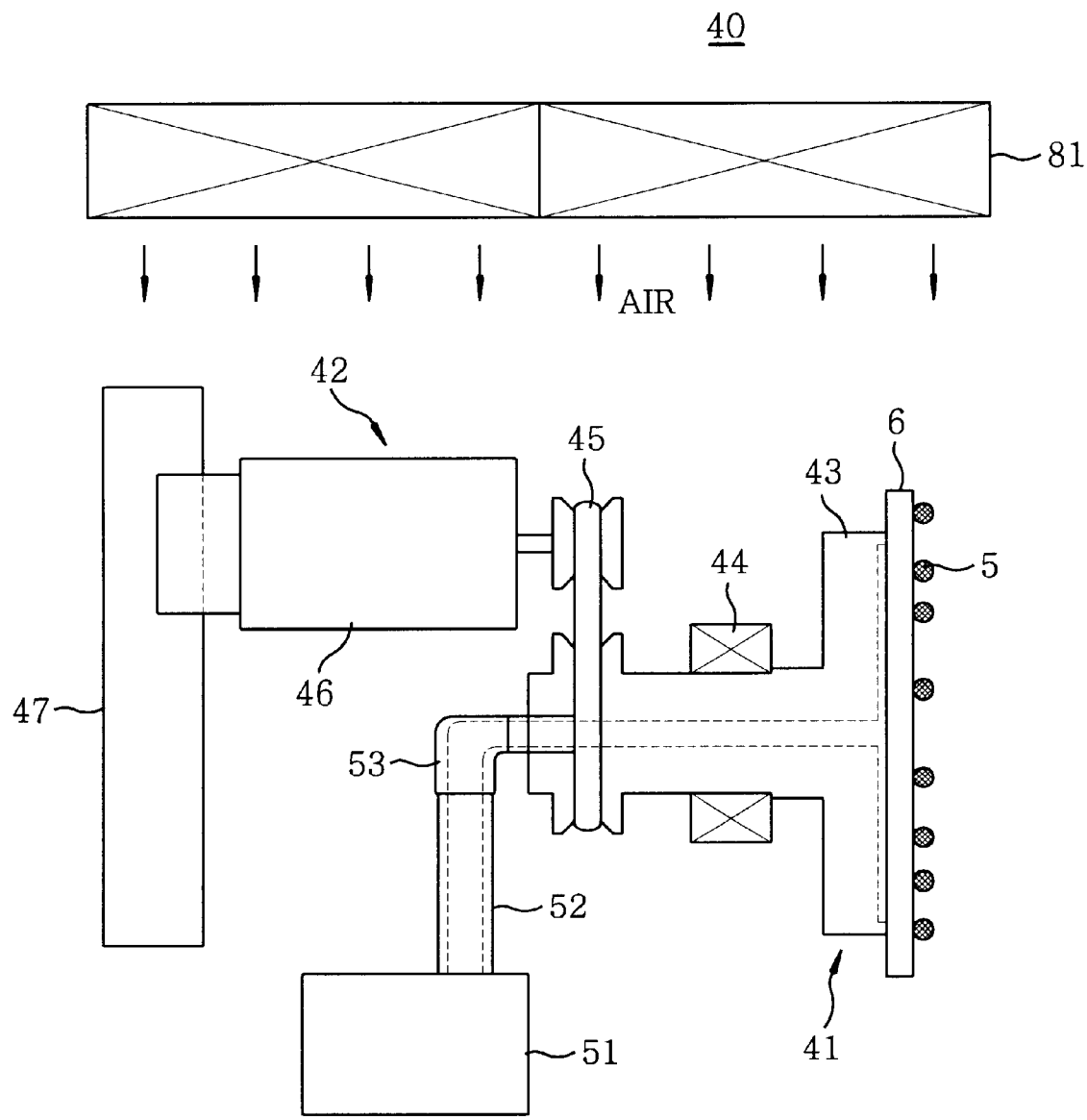
FIG. 7 sets forth a schematic view for a workpiece transfer unit in accordance with the present invention.

Referring to FIG. 7, there is shown a schematic view for a workpiece transfer means 40 in accordance with the present invention.

The workpiece transfer means 40 includes the workpiece holding unit 41 for firmly holding the workpiece 6 such as wafers, a rotational unit 42 for rotating the workpiece holding unit 41 to effectively clean the workpiece 6 and a linear motion unit 47. The workpiece holding unit 41 has the vacuum chuck 43 for securely holding the workpiece 6; the vacuum pump 51 for developing a vacuum state in the cavity between the workpiece 6 and the vacuum chuck 43; and a rotational fitting 53 and a vacuum line 52 for connecting the vacuum chuck 43 and the vacuum pump 51.

The rotational unit 42 is installed on a position opposite to the workpiece 6 with respect to the vacuum chuck 43 and has a bearing 44 for supporting the workpiece holding unit 41 to be rotated, a motor 46 and a power transfer unit 45. The linear motion unit 47 has a sliding unit for moving linearly the workpiece 6.

Surface contaminants 5 detached from the surface of the workpiece 6 by the plasma shock wave 25 or the shorter wave laser beam 14 may be blown by a centrifugal force due to the rotation of the workpiece 6 by the motor 46 so that they may be effectively removed. A fan unit 81 may be used to blow the surface contaminants 5 downwards. The linear motion unit 47 moves linearly along the left to right direction or along the upward to downward direction so that the workpiece 6 may be totally cleaned while it is rotating.

As described above, since the surface contaminants 5 may be cleaned with a smaller movement of the laser 1, the cleaning procedure may be stably performed. Further, the rotation of the workpiece 6 results in a fast cleaning and a surface contaminant blowing due to the centrifugal force. Because of the rotation of the workpiece 6, a movement of the workpiece 6 along each direction of the workpiece 6 by an amount of half the size thereof is sufficient to clean the workpiece 6 totally. Accordingly, the scanning procedure in accordance with the present invention is more efficient in view of time and space in comparison with the conventional two dimensional x-y scanning in which the workpiece 6 must be moved by as much as full size thereof along each direction of the workpiece.

Referring to FIG. 1, the surface of the workpiece 6 to be cleaned is kept horizontal. If, however, the surface of the workpiece 6 to be cleaned is inclined by a predetermined degree, e.g., 90 degrees, with respect to a horizontal plane as shown in FIG. 6, the surface contaminants 5 detached by the plasma shock wave 25 may not be attached again to the surface itself due to the gravitational force and the surface contaminants may be easily removed downwards according to the air flow from the fan unit 81.

As described above, since a laser can be used to generate two different laser beams for performing two different cleaning procedures one after the other or simultaneously in accordance with the present invention, organic particles that are hard to be removed by the conventional plasma shock wave can also be removed easily. Further, only one laser is capable of removing various contaminated materials.

A surface damage protection apparatus such as the rod or the prism in accordance with the present invention may be used to protect the surface damage of the workpiece, wherein the surface damage could be inflicted by a portion of laser beam which is directly illuminated on the surface of the workpiece in the conventional plasma shock wave cleaning procedure. Therefore, The surface damage protection apparatus in accordance with the present invention may be used to root out the surface damage on the susceptible workpiece such as wafers so that it may be used to perform a plasma shock wave dry cleaning effectively.

The beam expander and the laser nozzle in accordance with the present invention may be used to substantially enhance a cleaning efficiency on the conventional plasma shock wave cleaning.

The workpiece transfer unit in accordance with the present invention may be used to perform a fast cleaning and to prevent the detached surface contaminants from being attached again so that the surface contaminants may be permanently removed.

The apparatus in accordance with the present invention may be used in a dry surface cleaning process of a substrate wafer in the semiconductor manufacturing process, a surface cleaning process in the plat display manufacturing process such as LCD, TFT, PDP, OLED, ELD and the like and a surface cleaning process in the process for manufacturing micro electronic element, magnetic element, precision processing lens and so on.

While the invention has been shown and described with respect to the preferred embodiments, it will be understood by those skilled in the art that various changes and modifications may be made without departing from the spirit and scope of the invention as defined in the following claims.

What is claimed is:

1. A dry surface cleaning apparatus for removing surface contaminants on a surface of a workpiece comprising:
    a laser for generating a laser beam;
    a beam delivery control unit for splitting the laser beam into a first and a second laser beam, wherein the first and the second laser beam propagate along different directions from each other;
    a frequency modulator for modulating the second laser beam to generate a shorter wavelength laser beam, wherein the shorter wavelength laser beam has a shorter wavelength than that of the second laser beam and the shorter wavelength laser beam is used to directly detach the surface contaminants on the surface; and
    a laser focusing lens for converging the first laser beam on a laser focus around the surface of the workpiece to generate a plasma shock wave around the laser focus, wherein the plasma shock wave is used to clean the surface contaminants on the surface.

2. The apparatus of claim 1, further comprising a laser nozzle, installed around the laser focus, for injecting a gas to be ionized along the proceeding direction of the laser beam.

3. The apparatus of claim 2, wherein the gas is selected from a group which includes Ar, He, Ne and $N_2$.

4. The apparatus of claim 1, further comprising a transparent waveguide, installed along the proceeding direction of the first laser beam, for diverting a portion of the first laser beam which has not been used to generate the plasma shock wave.

5. The apparatus of claim 4, wherein the transparent waveguide is made of a transparent solid material selected in a group which has glass, quarts, diamond and NaCl crystal.

6. The apparatus of claim 4, wherein the transparent waveguide has a prism shape for performing total reflection on the portion of the first laser beam.

7. The apparatus of claim 4, wherein the transparent waveguide has a rod shape for performing total reflection on the portion of the first laser beam.

8. The apparatus of claim 1, wherein the beam delivery control unit is a beam splitter.

9. The apparatus of claim 1, wherein the beam delivery control unit is a switching mirror.

10. The apparatus of claim 1, wherein the frequency modulator is a frequency harmonic generator that generates the shorter wavelength laser beam whose wavelength ranges between about 100 nm and about 600 nm.

11. The apparatus of claim 1, further comprising a beam expander for increasing a size of the first laser beam to increase an output density of the first laser beam at the laser focus.

12. The apparatus of claim 1, wherein the laser beam is a laser pulse with a pulse period thereof ranging between about 1 and about 100 nanosecond, a pulse energy thereof ranging between about 0.1 and about 100 J and a wavelength thereof extending between about 500 and about 2000 nm.

13. The apparatus of claim 1, wherein a wavelength of the shorter wavelength laser beam is a half, a third or a fourth of a fundamental wavelength of the laser beam.

14. The apparatus of claim 13, wherein the fundamental wavelength of the laser beam is about 1064 nm of Nd:YAG laser.

15. The apparatus of claim 1, further comprising:
    a workpiece holding unit for holding the workpiece; and
    a moving unit for rotating and translating the workpiece.

16. The apparatus of claim 1, wherein the surface of the workpiece is inclined by a predetermined angle with respect to a horizontal plane.

17. The apparatus of claim 15, wherein the workpiece holding unit has:
    a vacuum chuck with a cavity to be adjacent to another surface of the workpiece;
    a vacuum pump for evacuating the cavity to hold the workpiece; and
    a vacuum line for connecting the vacuum chuck and the vacuum pump.

* * * * *